(12) United States Patent
Flinsenberg et al.

(10) Patent No.: US 10,762,064 B2
(45) Date of Patent: Sep. 1, 2020

(54) DATA REDUCTION FOR REDUCING A DATA SET

(71) Applicant: KONINKLIJKE PHILIPS N.V., Eindhoven (NL)

(72) Inventors: Ingrid Christina Maria Flinsenberg, Eindhoven (NL); Marc Aoun, Eindhoven (NL)

(73) Assignee: Koninklijke Philips N.V., Eindhoven (NL)

( * ) Notice: Subject to any disclaimer, the term of this patent is extended or adjusted under 35 U.S.C. 154(b) by 204 days.

(21) Appl. No.: 16/072,344

(22) PCT Filed: Jan. 17, 2017

(86) PCT No.: PCT/EP2017/050851
§ 371 (c)(1),
(2) Date: Jul. 24, 2018

(87) PCT Pub. No.: WO2017/129437
PCT Pub. Date: Aug. 3, 2017

(65) Prior Publication Data
US 2019/0034461 A1 Jan. 31, 2019

(30) Foreign Application Priority Data

Jan. 28, 2016 (EP) .................................... 16153051

(51) Int. Cl.
*G06F 17/00* (2019.01)
*G06F 7/00* (2006.01)
(Continued)

(52) U.S. Cl.
CPC ........ *G06F 16/215* (2019.01); *G06F 16/2465* (2019.01); *G06F 16/285* (2019.01);
(Continued)

(58) Field of Classification Search
CPC .. G06F 16/215; G06F 16/285; G06F 16/2465; G06F 17/18; G06K 9/6223; G06K 9/6228
(Continued)

(56) References Cited

U.S. PATENT DOCUMENTS 6,988,076 B2   1/2006  Ouimet
7,117,185 B1 * 10/2006  Aliferis ................. G06N 20/00
                                              706/12

(Continued)

OTHER PUBLICATIONS

Bala J et al: "Using Learning to Facilitate the Evolution of Features for Recognizing Visual Concepts", Evolutionary Computation, vol. 2, No. 3, Sep. 1996 (Sep. 1996), pp. 369409-311, XP055326154.
(Continued)

*Primary Examiner* — Pavan Mamillapalli

(57) ABSTRACT

A data reduction device (150) for and a method of reducing a data set based on a subset of variables from a set of variables are provided. Instances of the plurality of variables comprise information to predict an instance of a further type of data. The device comprises a first data set unit (102), a second data set unit (104), a searching unit (110) and a data reduction unit (152). The first data set unit obtains a first set comprising tuples of instances of data. The second data set unit obtains a second set comprising instances of the further type of data. Each instance of the second set corresponds to one of the tuples of the first set. The searching unit obtains a reduced set of variables that represents an at least local optimum of an optimization function being a combination of a first mutual information value between the reduced first set and the second set and a penalty value being based on a number of variables in the reduced set of variables.

16 Claims, 4 Drawing Sheets

(51) Int. Cl.
*G06F 16/215* (2019.01)
*G06K 9/62* (2006.01)
*G06F 17/18* (2006.01)
*G06F 16/28* (2019.01)
*G06F 16/2458* (2019.01)

(52) U.S. Cl.
CPC ........... *G06F 17/18* (2013.01); *G06K 9/6223* (2013.01); *G06K 9/6228* (2013.01)

(58) Field of Classification Search
USPC ........................................................ 707/693
See application file for complete search history.

(56) References Cited

U.S. PATENT DOCUMENTS

| | | | |
|---|---|---|---|
| 8,131,069 B2 * | 3/2012 | Komodakis | G06K 9/6297 382/165 |
| 8,218,880 B2 * | 7/2012 | Zhao | G06K 9/6234 382/118 |
| 8,504,498 B2 * | 8/2013 | Fox | G06N 3/126 706/13 |
| 8,554,771 B2 * | 10/2013 | Stork | G06K 9/6219 707/737 |
| 8,655,821 B2 | 2/2014 | Aliferis | |
| 8,805,083 B1 * | 8/2014 | Sieracki | G06K 9/723 382/190 |
| 9,336,302 B1 * | 5/2016 | Swamy | G06F 16/2465 |
| 9,772,741 B2 * | 9/2017 | Aliferis | G06F 3/0481 |
| 9,773,211 B2 * | 9/2017 | Barker | G06F 3/04812 |
| 2007/0122041 A1 | 5/2007 | Moghaddam | |
| 2007/0156471 A1 * | 7/2007 | Moghaddam | G06Q 40/00 705/37 |
| 2009/0271338 A1 * | 10/2009 | Chidlovskii | G06N 20/00 706/12 |
| 2009/0307160 A1 * | 12/2009 | Minh | G06N 7/005 706/12 |
| 2010/0169133 A1 | 7/2010 | Ben Bassat | |
| 2011/0246409 A1 * | 10/2011 | Mitra | G06F 17/18 706/52 |

OTHER PUBLICATIONS

Meiri R et al: "Using Simulated Annealing to Optimize the Feature Selection Problem in Marketing Applications", European Journal of Operational Research, vol. 171, No. 3, Jun. 16, 2006 (Jun. 16, 2006), pp. 842-858, XP024933714.
Liu Xiaoxing et al: "An Entropy-Based Gene Selection Method for Cancer Classification Using Microarray Data". BMC Bioinformatics, vol. 6, No. 1, Mar. 24, 2005 (Mar. 24, 2005), p. 76, XP021000970.
Esseghir M A., "Méthaheuristiques pour le problème de sélection d'attributs". PhD thesis. Université d'Artois, France, Sep. 2011, (Sep. 2011), XP055326152, Retrieved from the Internet: URL: http ://www.theses.fr/2011ART00206/document.
Battiti R: "Using Mutual Information for Selecting Features in Supervised Neural Net Learning", IEEE Transactions on Neural Networks, vol. 5, No. 4, Jul. 1994 (Jul. 1994), pp. 537-550, XP000460492.
Chow T W S et al: "Estimating Optimal Feature Subsets Using Efficient Estimation of High-Dimensional Mutual Information", IEEE Transactions on Neural Networks, vol. 16, No. 1, 2005, pp. 213-224, XP011125992.
Kwak, N. et al., "Input Feature Selection by Mutual Information Based on Parzen Window", IEEE Transactions on Pattern Analysis and Machine Intelligence, vol. 24, No. 12, Dec. 2002, pp. 1667-1671.
Peng, H. et al., "Feature Selection Based on Mutual Information: Criteria of Max-Dependency, Max-Relevance, and Min-Redundancy", IEEE Transactions on Pattern Analysis and Machine Intelligence, vol. 27, No. 8, Aug. 2005, pp. 1226-1238.
Belisle, C.J.P. et al., "Convergence Theorems for a Class of Simulated Annealing Algorithms on Rd", Journal of Applied Probability, vol. 29, No. 4 (Dec. 1992), pp. 885-895.

* cited by examiner

DATA REDUCTION FOR REDUCING A DATA SET

FIELD OF THE INVENTION

The invention relates to a data reduction device for reducing a data set based on a subset of variables from a set of variables comprising a plurality of variables and wherein the variables represent different type of data based on measurements of sensors, the instances of the variables comprising information for predicting an instance of a further type of data, and the further type of data relates to a characteristic of a physical entity.

The invention further relates to a method of reducing a data set based on a subset of variables from a set of variables comprising a plurality of variables, and to a computer program product for selecting a subset of variables from a set of variables comprising a plurality of variables.

BACKGROUND OF THE INVENTION

In machine learning technologies historic data is often used to train the machine to enable the machine to predict an event based on a recent set of data. In many cases, a huge amount of data is available and used to train the machine as good as possible. However, it may require quite a lot of data storage and processing power to use such a long training history. Also some other predictive technologies may directly use a data history of determined events and measured values. Then, the whole stored data history available may be used and when a prediction has to be made on basis of a recent set of data, the whole data history is processed to find similarities between the recent data with the data history—this requires quite a lot of processing power. There is a need to reduce the amount of historic data to be stored while maintaining its predictive benefits.

One approach may be to throw away data of variables (e.g. measurements of specific sensors) that are less relevant to predict the event. This is known as feature selection in traditional machine learning. There exist many methods to accomplish feature selection in traditional machine learning. Some examples are the following: Principal Component Analysis (PCA), Linear Discriminant Analysis (LDA), Random Forests, and Least Absolute Shrinkage and Selection Operator (LASSO). The first two methods have in common that they focus on the variance as variable of interest. LASSO focuses on minimizing the sum of squared errors, which is similar in flavor to the variance. Random Forest looks at performance loss of randomly permuted data.

It has been shown that the above feature selection solutions are suboptimal and that there is still room for improvement, in particular when one wants to select a specific set of features/variables that is going to be used to predict a specific event.

US2007/0122041A1 discloses a computer implemented method maximizes candidate solutions to a cardinality-constrained combinatorial optimization problem of sparse linear discriminant analysis, and implements the above discussed PCA, LDA and derived methods, which are all based on maximizing variance of the remaining data set using correlation measurements. As the variance is a second order statistic it does not take the full information content of the variables into account.

Above it has been mentioned that the predictive technologies are for predicting "an event". It has to be noted that the term "event" must be read broadly. "Event" may represent a characteristic of a physical entity, for example, "a component of a machine is going to break down or not", or "the energy consumption of the factory is going to be too high or not". These examples relate to a binary prediction: "something is true or not". However, the above discussed predictive technologies are not limited to binary characteristics and may predict the characteristics also for characteristics that have a value in a higher base numeral system, for example, "the energy consumption of this city is going to be low, medium, or high". The above discussed predictive technologies may also apply to regression use cases in which a scalar value is obtained based on historical data. The above interpretation also applies to the remaining of this document.

SUMMARY OF THE INVENTION

It is an object of the invention to provide an improved device and/or a method for reducing a data set based on a subset of relevant variables of a larger set of variables that must be kept or used when an instance of a further type of data has to be predicted on basis of (more recent) instances of the relevant variables. Relevant means in this context: a reliable prediction of the instance of the further type of data is possible on basis of (more recent) instances of the selected relevant variables. The invention is defined by the independent claims. The dependent claims define advantageous embodiments.

For this purpose, according to an aspect of the invention, a data reduction device for reducing a data set based on a subset of variables from a set of variables is provided. The plurality of variables represent different types of data. Instances of the plurality of variables are based on sensor data and comprise information to predict an instance of a further type of data. The further type of data relating to a characteristic of a physical entity. The device comprises a first data set unit, a second data set unit, a searching unit, and a data reduction unit. The first data set unit obtains a first set of data comprising tuples of instances of data, wherein each tuple comprises an instance of each variable of the set of variables. The second data set unit obtains a second set of data comprising instances of the further type of data, wherein each instance of the second set of data corresponds to one of the tuples of the first set of data. The searching unit obtains a reduced set of variables being a subset of the set of variables. The reduced set of variables represents an at least local optimum of an optimization function being a function of a reduced first set of data, the second set of data, and the reduced set of variables. The reduced first set of data comprising reduced tuples obtained from the tuples of the first data set. The reduced tuples only comprising instances of the variables of the reduced set of variables. The optimization function is based on, e.g. derived from, a combination of a first mutual information value between the reduced first set of data and the second set of data and a penalty value that increases with an increasing number of variables in the reduced set of variables. The data reduction unit generates a reduced data set from a data set that comprises tuples of instances of data, wherein each tuple comprises an instance of each variable of the set of variables. The reduced data set comprising instances of data of variables that are present in the reduced set of variables.

For this purpose, according to another aspect of the invention, a method of reducing a data set based on a subset of variables from a set of variables is provided. The plurality of variables representing different types of data. Instances of the plurality of variables are based on sensor data and comprise information for predict an instance of a further type of data. The further type of data relating to a characteristic of a physical entity. The method comprises i) obtaining a first set of data comprising tuples of instances of data, wherein each tuple comprises an instance of each variable of the set of variables, ii) obtaining a second set of data comprising instances of the further type of data, wherein each instance of the second set of data corresponds to one of the tuples of the first set of data, iii) searching for a reduced set of variables being a subset of the set of variables, the reduced set of variables representing an at least local optimum of an optimization function being a function of a reduced first set of data, the second set of data and the reduced set of variables, the reduced first set of data comprising reduced tuples obtained from the tuples of the first set of data and the reduced tuples only comprising instances of the variables of the reduced set of variables, the optimization function being based on a combination of a first mutual information value between the reduced first set of data and the second set of data and a penalty value that increases with an increasing number of variables in the reduced set of variables, iv) generating a reduced data set from a data set that comprises tuples of instances of data, wherein each tuple comprises an instance of each variable of the set of variables, the reduced data set comprising instances of data of variables that are present in the reduced set of variables.

The features of the data reduction device for and method of reducing a data set based on a subset of variables from a set of variables obtain a subset of variables that has been selected such that the mutual information between the reduced first set of data and the second set of data is still relatively high. Therefore, the reduced first set provides a good basis for reliably predicting instances of the further type of data. Furthermore, because the optimization function takes into account a penalty value that increases if the subset of variables has more variables, the subset of variables is most probably smaller than set of variables and, thus, the (historical) data to be stored, used or kept can be reduced. By using the reduced set of variables to reduce a data set that comprises tuples (similar to the tuples of the first set of data), the reduced data set still comprises quite a lot of mutual information with respect to instances of the further type of data. Thus, the reduced data set can be well used to predict (unknown) instances of the further type of data.

It is to be noted that the optimization function is being based on the first mutual information value and the penalty value. Depending on the exact optimization function, in the searching for the reduced set of variables an at least local minimum or an at least local maximum must be found. In this context it is in particular important to note that if the mutual information value between the reduced first set of data and the second set of data increases, then a conditional entropy value between of the second set of data given the reduced first set of data decreases. For example, the optimization function is a combination of the first mutual information value minus the penalty value. In that case, in the searching for the reduced set of variables, the at least local maximum must be found for the optimization function. In another example, the optimization function is a combination of a first conditional entropy for the second set of data given the reduced first set of data plus the penalty value. In this another example, in the searching for the reduced set of variables, the at least local minimum must be found for the optimization function.

Hereinafter embodiments of the method are discussed. The data reduction device has embodiments corresponding to the embodiments of the discussed method. The embodiments of the device have corresponding effects and advantages as the embodiments of the discussed method.

Optionally, the first mutual information value between the reduced first set of data and the second set of data is estimated by determining a second mutual information value between the second set of data and clustered data. The clustered data comprises clusters that are based on, e.g. derived from, the reduced first set of data. It may be that the reduced first set of data comprises, per unique tuple, a relatively low number of observations. Then the calculation of the first mutual information becomes relatively unreliable, if not impossible. Furthermore, it may be that the reduced first set of data comprises quite a lot observations, i.e. tuples, which may result in a relatively long processing time because many different probabilities and mutual probabilities must be calculated or estimated. The inventors have found that a heuristic that estimates the first mutual information value on basis of a second mutual information value may be useful. In particular, it is their insight that, despite clustering the data in the reduced first set of data, the heuristic still results in a reliable estimation of the mutual information. Optionally, the clusters are based on, e.g. derived from, a combination of the reduced first set of data and the second set of data. The inventors have found that, if the clustering is based on this specific combination, a loss of mutual information between the first mutual information and the second mutual information is relatively low. It is to be noted that the above discussed heuristic is a way of maintaining a relatively large amount of the mutual information between the reduced first set of data and the second set of data. However, other clustering algorithms may be used as well as long as they have also the effect of maintaining a relatively large amount of the mutual information between the reduced first set of data and the second set of data for example, in the detailed description of the embodiments, a reference is provided to an algorithm described by Cardinal that is based on a modification of Lloyd's algorithm for finding a quantize in which an information theoretic measure is used to determine distances between different tuples to be quantized (which are, in this context, the tuples of the first set of data).

Optionally, the clusters represents tuples of data that are a combination of a specific tuple of the reduced first set of data that is extended with a value that is based on, e.g. derived from, an instance from the second set of data that corresponds to the specific tuple of the reduced first set of data. Optionally, the values that are used to extend the tuples of the reduced first set of data are in the same order, i.e. are in the same numerical range, as the values of the instances in the tuples of the reduced first set of data.

Optionally, before being clustered, only unique tuples of the reduced first set of data are present in the reduced first set of data. Optionally, the clusters are formed on basis of data that comprises unique tuples of the reduced first set of data that are extended with a value that is based on the instances from the second set of data that correspond to the respective unique tuple. By basing the clustering on unique tuples, often the amount of data that must be clustered is reduced significantly and thereby the clustering can be performed more efficiently.

Optionally, the clustered data is obtained by a k-means clustering algorithm. The k-means clustering algorithm is, in particular, an effective algorithm to cluster tuples of instances of data. Optionally, the k-means clustering algorithm uses a Euclidean distance measure to determine distances between the tuples to be clustered. It is to be noted that other distance measures may also be used as long as they have an advantageous effect that the loss of mutual information is within acceptable boundaries, for example, it is expected that the KL distance is also a useful distance measure.

Optionally, the obtaining of the reduced set of variables representing the at least local maximum of the optimization function is performed by applying an iterative search method to find the at least local maximum to find the reduced set of variables that has a relatively large value for the optimization function. An iterative search method is useful to explore at least a portion of the solution space and find within the explored portion of the solution space the at least local maximum. It is to be noted that the found at least local maximum may be the global maximum of the optimization function.

Optionally, the iterative search method is based on simulated annealing. Simulated annealing is in this particular application an advantageous iterative search algorithm because the optimization function may have several local maxima. Simulated annealing is able to explore different areas of the solution space although the fact that these different areas may be separated from each other by solutions that have a relatively low value for the optimization function. Therefore, the simulated annealing search algorithm is capable of finding one of the best local maxima in an effective and efficient manner and thereby the probability of finding the global optimum is relatively high.

Optionally, each iteration of the iterative search method comprising i) forming a proposal of the reduced set of variables to be assessed, ii) determining the value of the optimization function that is provided by the proposed reduced set of variables, iii) storing the proposed reduced set of variables as a best reduced set of variables if the proposed reduced set of variables provides a best value for the optimization function until the currently executed iteration, iv) deciding whether the proposed reduced set of variables is accepted as a basis for a subsequent proposal of the reduced set of variables to be assessed in a subsequent iteration. Continuously storing the best solution found until the specific iteration is advantageous because the iterative search algorithm explores parts of the solution space that are away from the stored best solution found until that specific iteration. The proposal of the reduced set of variables is a means to explore the solution space, also at some distance away from the stored best solution. Accepting, or not accepting, the proposed reduced set of variables as a basis for a subsequent proposal is a means to direct the iterative search algorithm into a certain direction of the solution space. For example, if the proposed reduced set of variables provides a very worse value for the optimization function, this may be a sign that a solution close to that proposed reduced set of variables may also be worse solution and therefore one may decide not to accept this proposed set of variables as a basis for a subsequent proposed reduced set of variables. For example, if the proposed reduced set of variables provides a relatively good value for the optimization function, this may be a sign that a solution close to that proposed reduced set of variables may even be better and, therefore, one may decide to accept this proposed set of variables as a basis for a subsequent proposed reduced set of variables to explore an area of the solution space close to the proposed reduced set of variables.

Optionally, the iterative search method starts a first iteration with a proposal of the reduced set of variables comprising a single variable of which the mutual information between the data of that single variable and the second set of data is highest compared to the other variables of the set of variables. The choice for the first assessed proposal of the reduced set of variables is based on the insight that if one specific variable has a high mutual information between that one specific variable and the second set of data, then there is in the solution space most probably a good solution (a specific set of selected variables) that results in a relatively high value of the optimization function and that comprises the respective variable with the highest mutual information. Alternatively, for each single variable different reduced sets of variables comprising the single variable are formed and for each reduced set of variables a value for the optimization function is obtained and the one with the highest value for the optimization function is selected. This results in the same selection because the penalty value based is equal for all selections that comprise only a single variable.

Optionally, in the second or later iterations, the proposal of the reduced set of variables to be assessed is formed by extending or reducing the last accepted reduced set of variables. One of the variables of the set of variables is randomly selected. The randomly selected variable is added to the last accepted reduced set of variables if the randomly selected variable is not yet present in the last accepted reduced set of variables. The randomly selected variable is removed from the last accepted reduced set of variables if the randomly selected variable is present in the last accepted reduced set of variables. This optional embodiment allows the iterative search algorithm to move freely through the solution space such that it is capable of finding one of the best local maxima for the optimization function. Optionally, the randomly selected variable is obtained by a random selection that is based on a probability for each variable that is a sum of a first portion of a uniform probability value for each variable and a second portion of a non-uniform probability value that depends on, e.g. has been derived from, the mutual information between the data of the specific variable and the second set of data. By randomly selecting variables also on basis of the mutual information between the specific variable and the second set of data, and in particular if the randomly selected variable is added to the proposed reduced set of variables, the proposal of the reduced set is most probably a better solution that the last accepted solution.

According to a further aspect of the invention, a computer program product which is operative to cause a processor to perform one of the above discussed methods. The computer program product has embodiments corresponding to the embodiments of the above discussed device and methods. The embodiments have corresponding effects and advantages as the embodiments of the above discussed device and methods.

Further preferred embodiments of the device and method according to the invention are given in the appended claims, disclosure of which is incorporated herein by reference.

BRIEF DESCRIPTION OF THE DRAWINGS

These and other aspects of the invention will be apparent from and elucidated further with reference to the embodiments described by way of example in the following description and with reference to the accompanying drawings, in which FIG. 1 schematically shows an embodiment of a data reduction device for reducing a data set based on a subset of variables from a set of variables comprising a plurality of variables, FIG. 2 schematically shows an embodiment of a method of reducing a data set based on a subset of variables from a set of variables comprising a plurality of variables, FIG. 3 schematically shows two machines of the same type having a plurality of sensors, and FIG. 4 schematically shows an embodiment of a computer program product.

The figures are purely diagrammatic and not drawn to scale. In the Figures, elements which correspond to elements already described may have the same reference numerals.

DETAILED DESCRIPTION OF EMBODIMENTS

Figure 3:
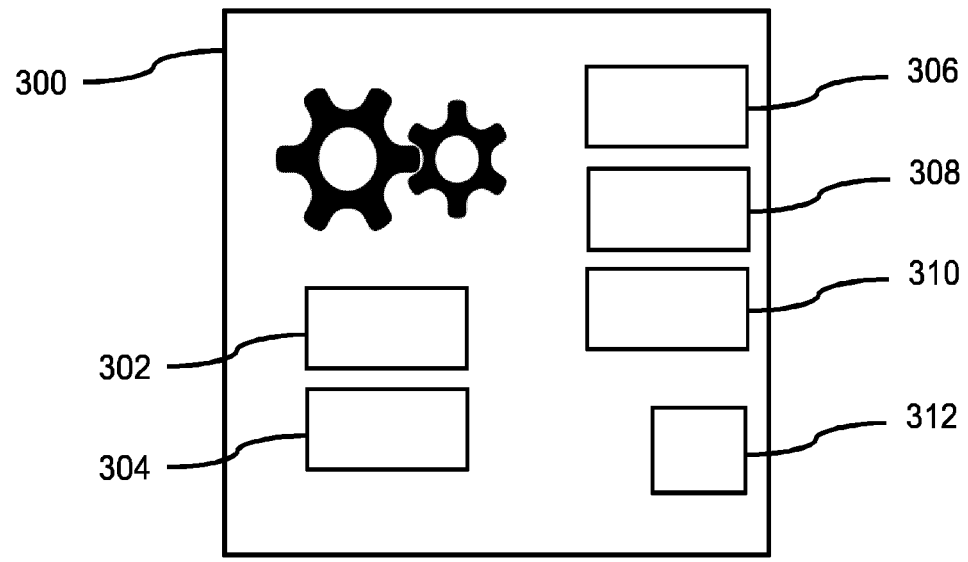
Figure 3:
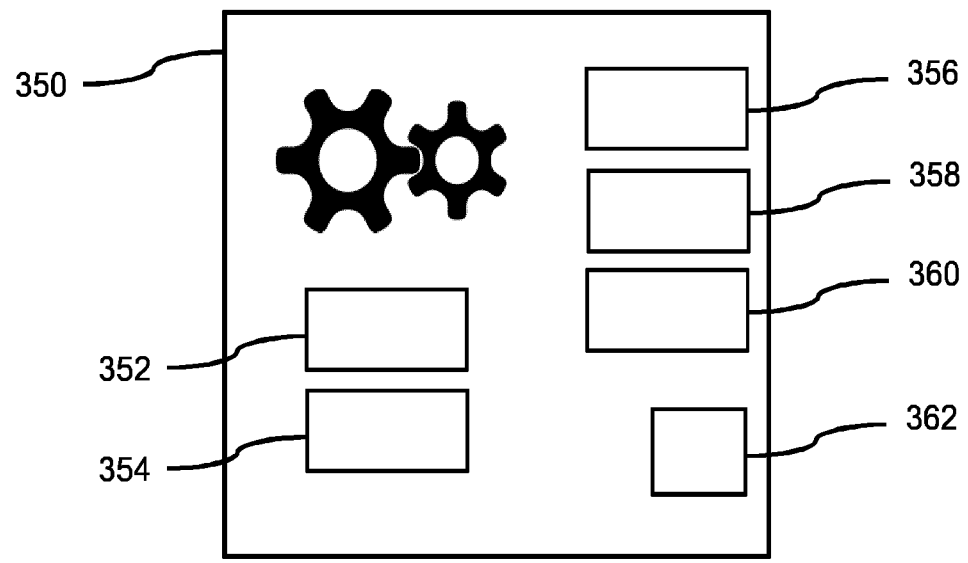

FIG. 3 schematically shows two machines 300, 350 of the same type. Both machines have a plurality of sensors 302 . . . 310, 352 . . . 360. In the following of this document, the data of one specific sensor is termed a variable. Instances of one variable originate from one type of sensor that has the same function. If at one specific moment in time all sensors 302 . . . 310, 352 . . . 360 of one machine 300, 350 measure and provide a value, instances of the variables are collected and together they form a tuple of instances of the variables. In this document it is assumed that the different variables have a specific order and that the instances of the variables are in the same order in the tuples. Both machines may also have a physical entity 312, 362 of which a characteristic may be determined or may be predicted. In the following of this document, a determined characteristic of physical entity is an instance of a further type of data. It is not necessary that the instances of the data of the further type originate from one specific physical entity, but it is relevant that the instances of the data of the further type originate from one specific type of physical entity, which means: the physical entities are equal to each other and that have the same function. A specific obtained characteristic of the physical entity belongs to a corresponding tuple of instances of the variables that is obtained from the same machine 300, 350 at the same moment of time.

For example, the physical entity 312, 362 is a motor and the characteristic is the operational status of the motor, for example, "operates well" or "malfunctions". If the motors drives, for example, a conveyer belt in the respective machines 300, 350, the sensors may sense different characteristics that may be relevant to predict the operational status of the motors. For example, a first sensor 302, 352 may measure the temperature of the motor. For example, a second sensor 304, 354 may measure the (electrical) power usage of the motor. For example, a third sensor 306, 356 may measure the speed of the conveyer belt. For example, a fourth sensor 308, 358 may measure the weight of the goods that are currently placed on the conveyer belt. For example, a fifth sensor 310, 360 may measure the amount of dust in the air present near the motor. Thus, the variables are: temperature of the motor, power usage of the motor, speed of the conveyor belt, weight of good on conveyer belt and amount of dust near motor. At regular moments in time, the operational status of the motor may be determined and at the same moments all sensor sense their specific characteristic. Then instances of the variables are obtained and these instances form one tuple, in the example, namely the 5-tuple (temp, power, speed, weight, dust-amount). At that specific moment in time the operational status of the motor may be determined and this determined characteristics belong to, corresponds to, the tuple with instances of the variables obtained/determined at the same moment in time. Please note that it may be difficult to obtain all measurements at the exact same moment in time. One may also read "within the same interval of time" instead of "at the same moment of time".

It is noted that in other practical embodiments the machines 300, 350 have a multitude of sensors 302 . . . 310, 352 . . . 360. The number of sensors per machine 300, 350 may be in the order of at least one hundred sensors, or in other embodiments, at least one thousand sensors. The sensors 302 . . . 310, 352 . . . 360 may provide measurements every relatively short interval or time, for example, every minute, or every five minutes. Therefore, every relatively short interval of time a large amount of data is generated by the sensors 302 . . . 310, 352 . . . 360 and every day an enormous amount of data has to be processed and/or stored. The sensor data is often stored in log-files which have quite often a size in the order of one or a multitude of Terabytes. Examples of machines that deliver such amounts of data are, for example, medical scanners, such as CT scanners, PET scanners, MRI scanners, etc.

FIG. 3 is an example of sources of data for the variables and for the characteristic of the physical entity. The example will be used in the subsequent discussion of the embodiments of the invention.

Figure 1:
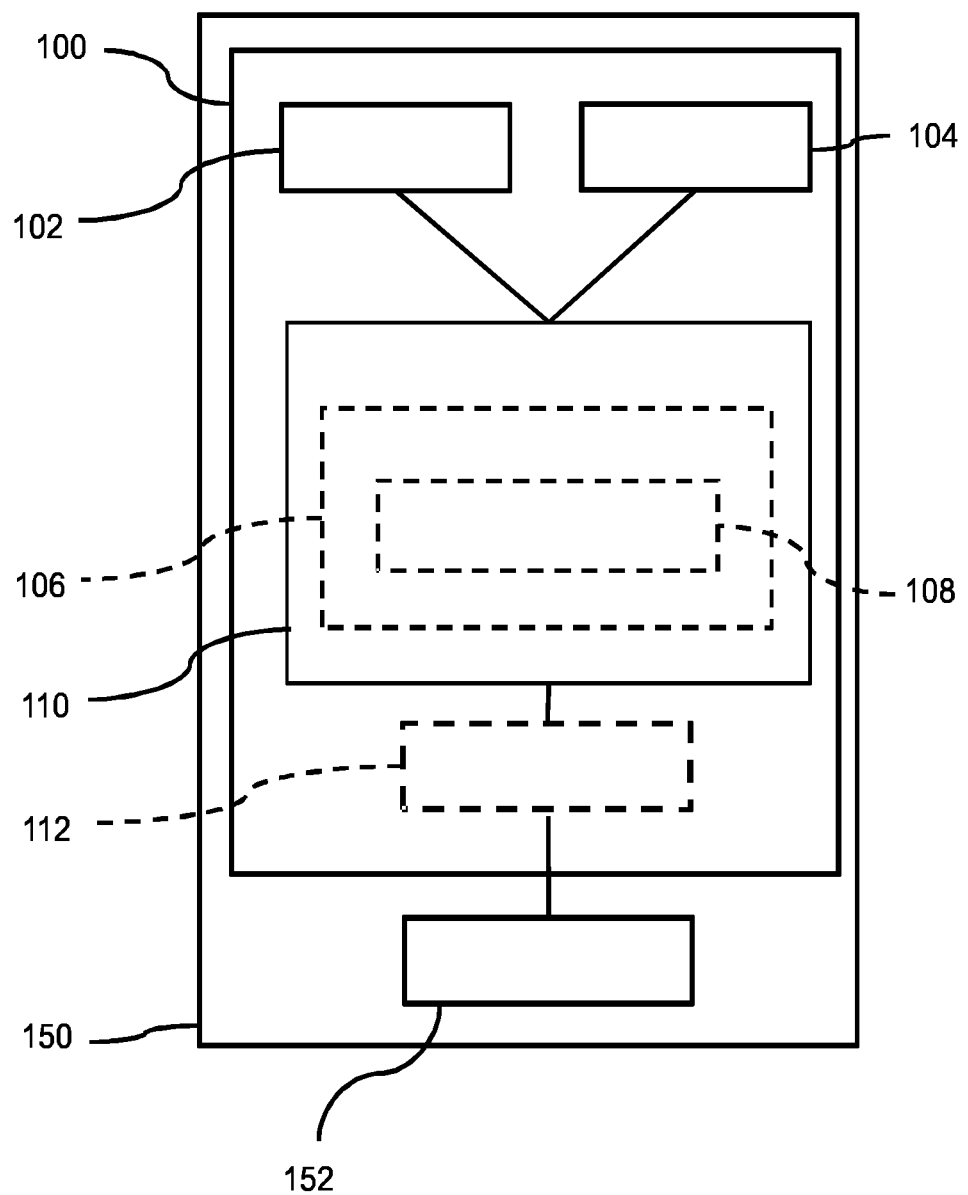

FIG. 1 schematically shows an embodiment of a data reduction device 150 that comprises a device 100 for selecting a subset of variables from a set of variables comprising a plurality of variables. For example, the set of variables is S (and is, for example, defined by the sensors 302 . . . 320, 352 . . . 360 of the machines 300, 350 of FIG. 3). The number of variables in the set of variables S is indicated by |S|. The variables are indicated with v. The subset is indicated by S* and S*⊆S. Preferably, the set of variable S comprises a plurality of variables v, and the subset S* comprises at least one variable. It is assumed that there is a relation between the instances of variables and an instance of a further type of data. The instances of the variables comprise information that may be relevant for predicting the instance of the further type. The further type of data relates to a characteristics of a physical entity, for example, the operational status of the motor 322 or 362 of one of the machines 300, 350, respectively. The instance of the further type of data is indicated with y.

The device 100 comprises a first data set unit 102 for obtaining a first of set data X comprising tuples $x_i$ of instances of data. Each tuples $x_i$ comprises an instance of each variable $v_j$ in the set of variable S. An instance of variable $v_j$ in tuple $x_i$ is indicated by $x_{ij}$. Each tuple $x_i$ in the first set of data X comprises the same number of instances $x_{ij}$, as the number of variables in the set of variables S. In the context of FIG. 3, one tuple $x_i$ is an observation of time of all sensor values at a specific moment of time or within a specific interval. The total number of observations, the total number of tuples $x_i$ in the first set of data X, is indicated with the number n. The tuples $x_i$ have all an equal length: they all have a number of instances that is equal to the number of variables in the set of variables S. In embodiments, the data present in the first set of data is discrete data that is obtained by quantizing continuous data provided by the sensors.

In an embodiment, the first set of data is represented by a matrix X:

$$X = \begin{bmatrix} x_{11} & \cdots & x_{1|S|} \\ \vdots & \ddots & \vdots \\ x_{n1} & \cdots & x_{n|S|} \end{bmatrix}$$

It is to be noted that the rows in the matrix X are the tuples $x_i$ and that the columns represent the variables $v_j$. Embodiments are not limited to the use of the above matrix X. The use of a matrix with the tuples as rows and the columns representing variables is just an implementation detail and a skilled person knows that matrices can be transposed or that an ordering between the columns or between the rows may be changed as well.

The device 100 also comprises a second data set unit 104 for obtaining a second set of data Y comprising instances the further type of data. As discussed earlier, this further type of data indicates a characteristics of a physical entity, for example, in the context of FIG. 3, the operational status of a specific type of motor of the machines. The instances of the further type of data are indicated with $y_i$. Each instance $y_i$ corresponds to a tuple $x_i$ in the first set of data X, which means that the instance is determined at the same moment of time, or during the same interval of time, as the instances of the variables of the tuples are obtained. Because there is a corresponding instance $y_i$ of the further type of data for each tuple $x_i$, there are n instances of the further type in the second set of data Y. In other words, there are n observations of the characteristic of the physical entity. The characteristics of the physical entity may be represented by binary values, but also by numbers from higher order numerical systems. If the characteristics of the physical entity are continuous values, the values may be quantized before being used in the device or method of this document.

In an embodiment, the second set of data Y is represented by:

$$Y = \begin{bmatrix} y_1 \\ \vdots \\ y_n \end{bmatrix}$$

The device 100 also comprises a searching unit 110 for obtaining a reduced set of variables $S_r$. The searching unit 110 is coupled to the first data set unit 102 and to the second data set unit 104 for receiving the first set of data X and the second set of data Y, respectively. The reduced set of variables is a subset of the set of variables S, $S_r \subseteq S$. The reduced set of variables $S_r$ represents an at least local maximum of an optimization function $f$ that is a function of a reduced first set of data, the second set of data and the reduced set of variables. The reduced first set of data comprising reduced tuples being based on the tuples of the first set of data, and the reduced tuples only comprising instances of the reduced set of variables. The reduced first set of data being indicated by $X_r$ and each reduced tuple in the reduced first set of data $X_r$ is indicated with $x_{ri}$. Hence, the optimization function is $f(X_r, Y, S_r)$. The optimization function $f$ being a combination of a first mutual information value between the reduced first set of data and the second set of data minus a penalty value that increases with an increasing number of variables in the reduced set of variables. The first mutual information is, in accordance with information theory, indicated by $I(X_r, Y)$. The penalty value is a function of the number of elements in the reduced set of variables, $p(|S_r|)$, wherein $|S_r|$ is the number of variables in the reduced set of variables $S_r$. If the number of elements in the reduced set of variables is higher, the penalty value is also higher. Thus, the optimization function is $f(X_r, Y, S_r)=I(X_r, Y)-p(|S_r|)$. In an example, the penalty value is the number of elements in the reduced set of variables $S_r$ that is normalized for the number of variables in the set of variables S, hence, $p(|S_r|)=|S_r|/|S|$, wherein $|S|$ is the number of variables in the set of variables S.

The device 100 optionally comprises an output 112 for providing the reduced set of variables $S_r$ as the selected subset of variables S*. The output 112 is coupled to the searching unit 110 for receiving the reduced set of variables $S_r$.

In an example, the device 100 for selecting a subset of variables from a set of variables comprising a plurality of variables is part of a data reduction device 150. The data reduction device also comprises a data reduction unit 152 that is coupled to the output 112 for receiving the selected subset of variables S* or is directly coupled to the searcher unit for receiving the selected subset of variables S*. The data reduction unit 152 is configured to reduce the tuples $x_p$ in a data set X' to obtain a reduced data set $X_r'$ such that the reduced tuples $x_{rp}$ only comprise instances $x_{pj}$ of variables that are present in the selected subset of variables S*. The data reduction unit 152 may be configured to store the reduced data set $X_r'$. The data reduction unit 152 may be configured to provide the reduced data set $X_r'$ to a subsequent device that uses, for example, the reduced data set $X_r'$ in predictions of events (i.e. instance y of the further type of data). In a specific embodiment, the data set X' is the first set of data X, and, thus, the data reduction unit 152 may generate a reduced first set of data $X_r$ that can be used as a training set in machine learning applications.

Figure 2:
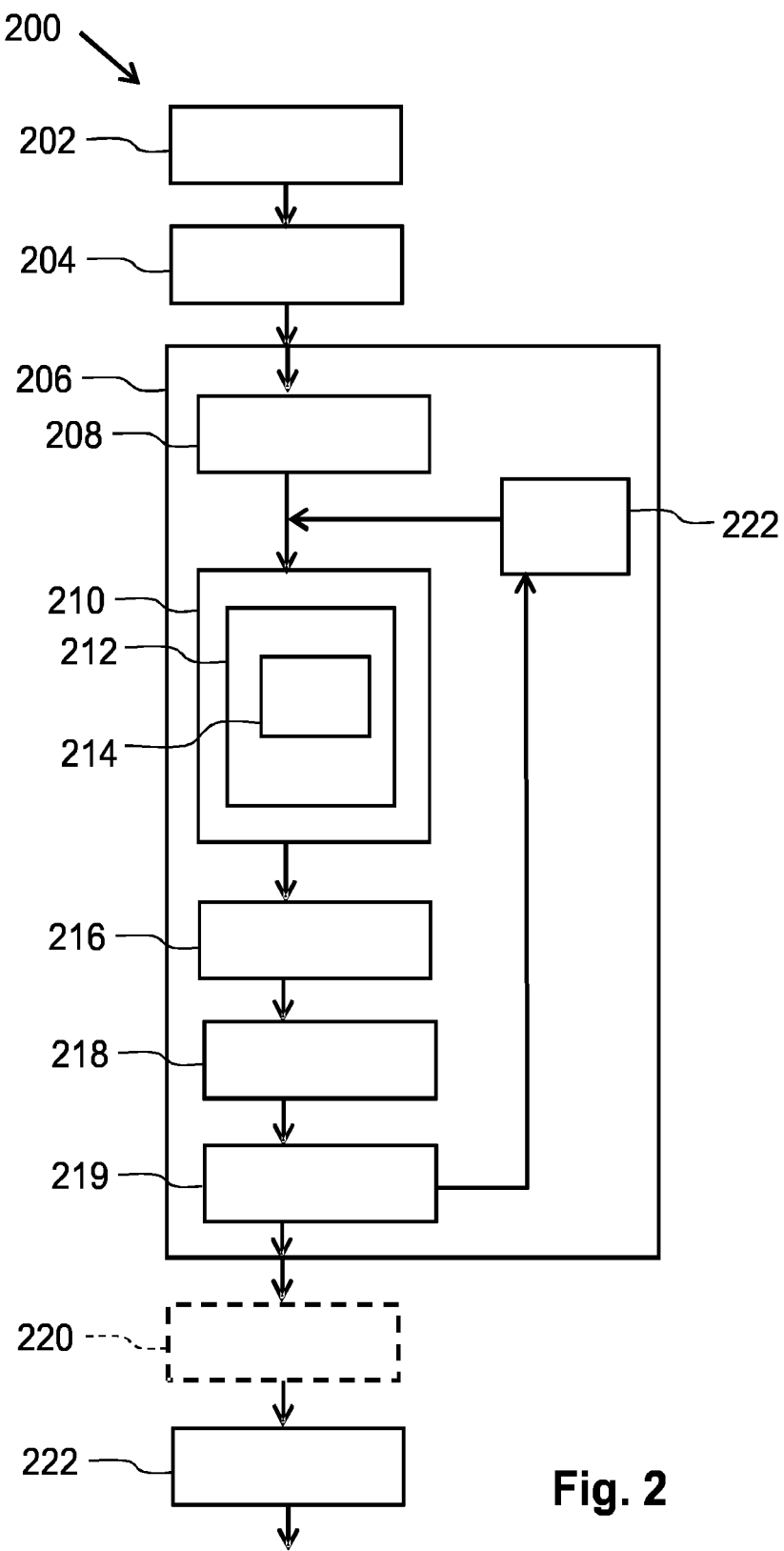

FIG. 2 schematically shows an embodiment of a method 200 of selecting a subset of variables S* from a set of variables S comprising a plurality of variables $v_j$. The variables $v_j$ represent different type of data based on measurements of sensors, for example the sensors 302 . . . 310, 352 . . . 360 of the machines 300, 350 of FIG. 3. The instances $x_{ij}$ of the variables $v_j$ comprising information for predict an instance y of further type of data. The further type of data relating to a characteristic of a physical entity, for example, the physical entities 312, 362 of the machines 300, 350 of FIG. 3.

The method 200 comprises obtaining 202 a first set of data X comprising tuples $x_i$ of instances of data. Each tuple comprises an instance $x_{ij}$ of each variable $v_j$ of the set of variables S.

More details of the first set of data X, the second set of data Y, the set of variables S, and the reduced set of variables S* have been discussed in the context of FIG. 1. The earlier discussed characteristics of these forms of data also apply to this method. Hereinafter more details of these forms of data are discussed and these details also apply to the device 100 of FIG. 1.

The method 200 comprises obtaining 204 a second set of data Y comprising instances $y_i$ of the further type of data. Each instance $y_i$ of the second set of data Y corresponds to one of the tuples $x_i$ of the first set of data X.

The method 200 comprises searching 206 for a reduced set of variables $S_r$ that is a subset of the set of variables S. The reduced set of variables $S_r$ represents an at least local optimum of an optimization function $f$ being a function of a reduced first set of data, the second set of data and the reduced set of variables, hence, $f(X_r, Y, S_r)$. The reduced first set of data $X_r$ comprising reduced tuples $xr_i$ that are based on the tuples $x_i$ of the first set of data X The reduced tuples $xr_i$ only comprising instances $x_{ij}$ of variables of the reduced set of variables $S_r$. The optimization function $f$ being a combination of a first mutual information value I between the reduced first set of data $X_r$ and the second set of data Y minus a penalty value pv that increases with an increasing number of variables in the reduced set of variables. Hence, $f(X_r, Y, S_r)=I(X_r, Y)-p(|S_r|)$.

The method 200 optionally comprises providing 220 the reduced set of variables $S_r$ as the selected subset of variables S* to, for example, a data reduction arrangement for reducing the amount of data in the first set of data X.

The method 200 comprises generating 222 the reduced first set of data $X_r$' as discussed in the context of the data reduction device 150.

The method 200 may be implemented in and executed by a general purpose computer by means of loading a program into the computer, and the program is operative to cause the processor of the computer to perform the method 200. The Input/Output interfaces of the computer are used to receive the first set of data, the second set of data, to output the reduced set of variables and/or to output the reduced first set of data. The memory of the computer is used to store the set of data and the sets of variables. The method 200 may also be implemented in and executed by dedicated hardware that is specifically designed to execute the method 200.

Optionally, the searching 206 for the reduced set of variables $S_r$ is based on an iterative searching algorithm. Optionally, the iterative searching algorithm is based on simulated annealing. Several details of the iterative searching algorithm are discussed hereinafter. It is to be noted that other searching algorithms that are capable of finding an at least local maximum of the optimization function can be used as well. Simulated annealing is, in particular, advantageous because it is able to explore many areas of the solutions space and is capable of finding a relatively good local maximum and possibly the global maximum. In particular, in the context of simulated annealing, an imaginary temperature function that decreases (or remains equal) during each iteration is important as well as a probability function to accept whether the solution that is assessed during the current iteration is accepted as a basis for a solution to be assessed in a subsequent iteration. For an example of such an imaginary temperature function and probability function, and also for more information about simulated annealing, a reference is provided to the article: "Convergence Theorems for a Class of Simulated Annealing Algorithms on $R^d$" of Claude J. P. Bélisle, Journal of Applied Probability, Vol. 29, No. 4 (December, 1992), pp. 885-895. The article of C. J. P. Bélisle is herewith incorporated by reference. In particular, this article discusses a Metropolis function for the probability function and the inventors have found that this function leads to good results in the context of this document. In particular, Bélisle discusses a logarithmic cooling schedule, for example, the temperature is set to temp/log((floor((t−1)/tmax))*tmax+exp(1))), where t is the current iteration step, floor( ) is a function that returns the integer part of a value, and temp and tmax are variables. The inventors have used temp=200 or temp=100 and tmax=10. It has to be noted that other values may be used as well for the variables temp and tmax.

Optionally, during each iteration of the iterative searching algorithm the subsequent data is used: the combination of $S_{r\_best}$, $f_{best}$ which are the best reduced set of variables found until the current iteration and its corresponding value of the optimization function, respectively; $S_{r\_accepted}$ which is a reduced set of variables that is accepted at the end of one of the previous iterations as the reduced set of variables that forms the basis for a current or a subsequent proposal of a reduced set of variables that has to be assessed in the current or a subsequent iteration; and $S_{r\_proposal}$, which is a proposal for the reduced set of variables that must be assessed during the current iteration, and $X_{r\_proposal}$ which is a proposed reduced first set of data that comprises proposed reduces tuples of data $x_{r\_proposed}$ that only comprise instance of variables of the proposed reduced set of variables $S_{r\_proposal}$. "Being assessed" means in this context that, in the iteration, a value for the optimization function is determined for the proposed reduced set of variables $S_{r\_proposal}$ and it is checked whether this is the best solution until the current iteration and it is checked whether this is a good solution to be accepted as a basis for a subsequent proposed reduced set of variables.

Optionally, the iterative searching algorithm starts a first iteration with proposing 208 a proposal of the reduced set of variables $S_{r\_proposal}$ comprising a single variable of which the mutual information between the data of the single variable and the second set of data is highest compared to the other variables of the set of variables. This is a greedy first selection of the reduced set of variables to be assessed and is a good starting point for finding an at least local maximum of the optimization function. If it is assumed that the data of the single variable $v_j$ is $$D = \begin{bmatrix} d_1 \\ \vdots \\ d_n \end{bmatrix} = \begin{bmatrix} x_{1j} \\ \vdots \\ x_{nj} \end{bmatrix}$$

and, as discussed previously, the second set of data $$Y = \begin{bmatrix} y_1 \\ \vdots \\ y_n \end{bmatrix},$$

then the mutual information is calculated by $$I(Y, D) = \sum_{k=1\ldots n} \sum_{l=1\ldots n} p(y_k, d_l) \log\left(\frac{p(y_k, d_l)}{p(y_k)p(d_l)}\right),$$

wherein $P(y_k)$ is the probability that a value of Y is equal to the value of $y_k$, $P(d_1)$ is the probability that a value of D is equal to the value of $d_1$, and $P(y_k, d_1)$ is the probability that a value of Y is equal to $y_k$ and a corresponding value of D is equal to $d_1$. During this initialization of the iterative searching algorithm, one may also set the other data that is used in the subsequent iterations. For example, the best reduced set of variables $S_{r\_best}$ found until this iteration is set to the selected single variable. The value of the optimization function $f_{best}$ belonging to the best reduced set of variables $S_{r\_best}$ may be set to the value of the optimization function for a reduced first set that is based on the best reduced set of variable $S_{r\_best}$. The accepted reduced set of variables $S_{r\_accepted}$ may be set to the first proposal of the reduced set of variables $S_{r\_proposal}$.

Optionally, each iteration of the iterative searching algorithm comprises determining 210 the value of the optimization function for the proposed reduced first set of data $X_{r\_proposal}$ that is based on proposed reduced set of variables $S_{r\_proposal}$. Determining 210 the value of the optimization function for proposed reduced first set of data $X_{r\_proposal}$ includes forming the proposed reduced first set of data $X_{r\_proposal}$ that has reduced tuples $x_{r\_proposal}$ wherein each reduced tuple $xr_{i\_proposal}$ is based on a corresponding tuple $x_i$ of the first set of data X and comprises only instances of variables that are present in the proposed reduced set of variables $S_{r\_proposal}$. Thus, in the stage of determining 210, $f(X_{r\_proposal}, Y, S_{r\_proposal})$ is determined.

The determining 210 of the value of the optimization function $f$ includes determining the mutual information I between the proposed reduced first set of data $X_{r\_proposal}$ and the second set of data Y. Optionally, this determining of the mutual information comprises estimating the mutual information between the proposed reduced first set of data $X_{r\_proposal}$ and the second set of data Y by determining 212 a second mutual information $I_2$ between the second set of data Y and clustered data Q. The clustered data Q comprises clusters that are based on the proposed reduced first set of data $X_{r\_proposal}$. Thus, $I(X_{r\_proposal}, Y) \approx I_2(Q, Y)$.

Optionally, the stage of determining 212 the second mutual information $I_2$ comprises clustering 214 data. Clusters Q are formed that are at least based on the proposed reduced first set of data $X_{r\_proposal}$. Hereinafter a heuristic is discussed that may be used for clustering the data. The inventors have found that in the hereinafter discussed heuristic maintains a relatively large portion of the mutual information between the proposed reduced first set of data $X_{r\_proposal}$ and the second set of data Y such that $I(X_{r\_proposal}, Y) \approx I_2(Q, Y)$. It is to be noted that embodiments of clustering the data is not limited to this heuristic. In the context of this document, it is important that the clusters are formed such that a large portion of mutual information between the proposed reduced first set of data $X_{r\_proposal}$ and the second set of data Y is maintained. A reference to an alternative algorithm is provided of which it is known that it is capable of maintaining a relatively large amount of mutual information between the proposed reduced first set of data $X_{r\_proposal}$ if the proposed reduced first set of data $X_{r\_proposal}$ is clustered by this algorithm: For example, Cardinal ("Quantization with an Information-Theoretic Distortion Measure") describes a method using a modified Lloyd's algorithms to quantize data such that the mutual information between X and Y does not much reduce as the result of the quantizing. The document "Quantization with an Information-Theoretic Distortion Measure", Jean Cardinal, Oct. 23, 2002, published by the "Université Libre de Bruxelles" on the website http://www.ulb.ac.be/di/publications/RT_2002.html, and also published on the website http://citeseerx.ist.psu.edu/viewdoc/summary-?doi=10.1.1.20.3058, is included by reference.

In the heuristic, the data that is the basis for forming the clusters is based on a combination of the reduced tuples of $X_{r\_proposal}$ and corresponding instances of the second set of data Y. The data that is the basis for the clustering is indicated by Z and, $Z = g(X_{r\_proposal}, Y)$, wherein g is a function that generates data that are based on the reduced tuples of the proposed reduced first set of data $X_{r\_proposal}$ and on the corresponding instances of the second set of data Y. Optionally, Z comprises tuples of instances of data.

Optionally, the total number of tuples of data in Z corresponds to the number of unique tuples in the proposed reduced first set of data $X_{r\_proposal}$.

Optionally, each tuple in Z starts with one of the unique tuples of the proposed reduced first set of data $X_{r\_proposal}$ and is extended with a value that is based on the instances of data of the second set of data Y that correspond to, belong to, the one of the unique tuples. For example, in the proposed reduced first set of data $X_{r\_proposal}$ there may be several unique tuples and a first unique tuple $ux_1$ occurs, for example, two times. Then, in the second set of data Y, there are two instances $y_k$, $y_1$ of data that correspond to the unique tuple $ux_1$ and the value that is used to extend the unique tuple $ux_1$ in the data Z is a function of $y_k$, $y_1$. In an embodiment, the value that is going to be added to the unique tuple $ux_1$ is in the same order as the possible values of the instances in the unique tuple $ux_1$. For example, if the possible values of the instances in the unique tuple can range from 0 to 10, then the value that is added is normalized towards a value that may also end up between 0 and 10.

In other words, in an embodiment, the data that is going to be used for the clustering may be the subsequent data:

$$Z = \begin{bmatrix} ux_1 & v_1 \\ \vdots & \vdots \\ ux_m & v_m \end{bmatrix},$$

wherein m is the number of unique tuples in the proposed reduced first set of data $X_{r\_proposal}$; wherein $ux_1$ is one of the unique tuples and forms the beginning of the rows of Z; and wherein $v_1$ is a value that is added to each row of Z and is based on the instances of data of the second set of data Y that correspond to, belong to, the unique tuple $ux_1$ of that row. Optionally, the value $v_1$, assuming that the instances of the second set of data Y may have a binary value (e.g. 0 or 1), may be calculated by: $v_1 = P$ (instance of Y $y_i=1$ only for $1^{th}$ unique sequence)$|S|\sqrt{n}\alpha$, wherein $|S|$ is the number of variables in the set of variables; wherein $\sqrt{n}$ is the square root of the number of rows in the proposed reduced first set of data $X_{r\_proposal}$ (and, thus, also the number of rows in the first set of data X and the number of rows of the second set of data Y, hence, the value of n is the number of observations in the first and second set of data X, Y); wherein $\alpha$ is a variable that may be chosen to, for example, normalize the possible values of $v_1$ to a specific range; and wherein P (instance of Y $y_i=1$ only for $1^{th}$ unique sequence) represents the probability that instances of the second set of data Y, which are the instances that correspond to, belong to, the unique tuple $ux_1$ have the value of 1. In a practical embodiment $\alpha$ is larger than 0 and smaller than or equal to 1. If appropriate, a value larger than 1 may also be used.

Then in the stage of clustering 214 the data Z, a number of clusters are formed in which tuples of data Z (e.g. rows of matrix Z) are grouped together on basis of a distance measure. Thus, each cluster represents tuples of data Z that are, according to the distance measure, close to each other. The distance measure may be a Euclidean distance, or may be a distance measure that is based on information theory such as, for example, a KL distortion (sometimes referred to as KL distance). In the stage of clustering, for example, $\sqrt{n}$ clusters are formed, wherein n is the above discussed number of rows/observations in the proposed reduced first set of data $X_{r\_proposal}$. Also another number of clusters may be formed, but it is known from information theory that when $\sqrt{n}$ clusters are formed a relatively large amount of mutual information is maintained, while the number of clusters is relatively small. The clustering may be based on a k-means algorithm with uses one of the above examples of a distance measure.

In the subsequent description, the clusters are represented by data Q, which may be a $$Q = \begin{bmatrix} 1 \\ \vdots \\ p \end{bmatrix},$$

wherein p is the number of clusters—in other words, each cluster may be represented by a tuple number in data Q. Each cluster is indicated by $q_i$. Subsequently it is important to realize that: each cluster $q_i$ comprises a number of tuples from the data Z, each tuple of Z corresponds to a number of reduced proposed tuples $xr_{i\_proposal}$ in the proposed reduced first set of data $X_{r\_proposal}$ (via the unique tuples of the proposed reduced first set of data $X_{r\_proposal}$) and, thus, each cluster $q_i$ represents a number of tuples (i.e. observations) of the proposed reduced first set of data $X_{r\_proposal}$ and this number is indicated by $|q_i|$.

If clustering 214 the data is ready, in the stage of determining 212 the second mutual information $I_2(Q, Y)$, the second mutual information can be calculated by $$I(Q, Y) = \sum_y \sum_q p(y, q) \log\left(\frac{p(y, q)}{p(y)p(q)}\right),$$

wherein P(q) represents the probability that a tuple of the proposed reduced first set of data $X_{r\_proposal}$ is represented by, ended up in, segment q, P(y) represents the probability that an instance of the second set of data Y is equal to y, P(y,q) represents the probability a tuple of the proposed reduced first set of data $X_{r\_proposal}$ is represented by segment q and that the corresponding instance of the second set of data Y is equal to y. Thus, P(q)=|q|(total number tuples in proposed reduced first set of data $X_{r\_proposal}$)=|q|/n. Thus, P(y)=(number occurances of y in Y)/(total number instances in second set of data Y)=(number occurances of y in Y)/n. P(y,q)=(number occurrences of y in segment q)/(total number tuples in proposed reduced first set of data $X_{r\_proposal}$)=(number occurances of y in segment q)/n.

Optionally, after determining the value of the optimization function for the proposed subset of variables, each iteration of the iterative searching algorithm comprises storing 216 the proposed reduced set of variables $S_{r\_proposal}$ as the best reduced set of variables $S_{best}$ if the proposed reduced set of variables $S_{r\_proposal}$ provides a best value for the optimization function until the currently executed iteration. This stage includes comparing the value of the optimization function $f(X_{r\_proposal}, Y, S_{r\_proposal})$ as determined in stage 210 with a previously stored best value $f_{best}$ of the optimization function. If $f(X_{r\_proposal}, Y, S_{r\_proposal}) > f_{best}$ then $S_{best} = S_{r\_proposed}$ and $f_{best} = f(X_{r\_proposal}, Y, S_{r\_proposal})$.

Optionally, each iteration of the iterative searching algorithm comprises deciding 218 whether the proposed reduced set of variables $S_{r\_proposal}$ is accepted as a basis for a subsequent proposal of the reduced set of variables to be assessed in a subsequent iteration. If the proposed reduced set of variables $S_{r\_proposal}$ is accepted as the basis, then $S_{r\_accepted} = S_{r\_proposal}$. In an embodiment, in particular if simulated annealing is used, the earlier described probability function in the article of C. J. P. Bélisle ("Convergence Theorems for a Class of Simulated Annealing Algorithms on $R^d$") can be used as an acceptance function. In another embodiment, the acceptance of the proposed reduced set of variables $S_{r\_proposal}$ may be based on comparing the value of the optimization function $f(X_{r\_proposal}, Y, S_{r\_proposal})$ with the previously stored best value $f_{best}$ of the optimization function. For example, if the value of the optimization function $f(X_{r\_proposal}, Y, S_{r\_proposal})$ is larger than the previously stored best value $f_{best}$ minus a threshold value, then the proposed reduced set of variables $S_{r\_proposal}$ is accepted as a basis for a subsequent proposal of the reduced set of variables.

Optionally, each iteration of the iterative searching algorithm comprises deciding 219 whether another iteration has to be made or that the iterations stop and that the best found reduced set of variables $S_{r\_best}$ is considered to be the result of the searching 206 for the reduced set of variables $S_r$. In specific embodiments, the decision whether the iterations have to stop may be based on the number of iterations performed until that moment in time, the amount of computing power used until that moment in time, or the time spent on the searching for the reduced set of variables $S_r$. Another stop criterion may be that the iterative searching algorithm administers how large the improvement of the best value for optimization function is during a specific number of previous iterations and if the improvement is below a certain threshold, it may be decided to stop the iterations. In another embodiment, in particular if simulated annealing is used, the iterations may stop if the temperature is below a certain threshold temperature.

Optionally, each iteration of the iterative searching algorithm comprises forming 222 a proposal of the reduced set of variables $S_{r\_proposal}$ to be assessed. To explore areas of the solution space, in many iterations, the proposed reduced set of variables $S_{r\_proposal}$ is different from a previous assessed proposed reduced set of variables $S_{r\_proposal}$. In an embodiment, the previously accepted set of variables $S_{r\_accepted}$ is either enlarged with a single variable or reduced with one variable. This may be done by randomly selecting one of the variables $v_{random}$ of the set of variables S. If the selected variable $v_{random}$ is not yet present in the previously accepted set of variables $S_{r\_accepted}$, then the proposed reduced set of variables $S_{r\_proposal}$ is equal to previously accepted set of variables $S_{r\_accepted}$ plus the selected variable $v_{random}$. If the selected variable $v_{random}$ is already present in the previously accepted set of variables $S_{r\_accepted}$, then the proposed reduced set of variables $S_{r\_proposal}$ is equal to previously accepted set of variables $S_{r\_accepted}$ minus the selected variable $v_{random}$. If this would result in an empty proposed reduced set of variables $S_{r\_proposal}$, then another variable $v_{random2}$ is randomly selected and the proposed reduced set of variables $S_{r\_proposal}$ comprises one variable, namely the another randomly selected variable $v_{ramdom2}$. Randomly selecting the variables from the set of variables S may be based on a uniform selection of one of the variables. In another embodiment, the probability that a specific variable is selected may, in addition or alternatively, depend on the mutual information between the data of that specific variable and the second set of data Y. Thus, the selection probability may be $$P_{select}(v_i) = (1 - \beta)\frac{1}{|S|} + \beta \frac{I(Y, \text{data of variable } v)}{\sum_v I(Y, \text{data of variable } v)},$$

wherein β is a value selected from the interval [0,1] and that is used to control the contribution of the uniform probabilities and the probabilities based on the mutual information. I(Y, data of variable v) can be determined, as discussed once before in this document by: the data of the single variable is $D=(d_1, \ldots, d_n)$ and the second set of data $Y=(y_1, \ldots, y_n)$, then the mutual information is calculated by $$I(Y, D) = \sum_{k=1\ldots n} \sum_{l=1\ldots n} p(y_k, d_l) \log\left(\frac{p(y_k, d_l)}{p(y_k)p(d_l)}\right).$$

If β is a value that is close to 1, then the selection of the randomly selected variable $v_{random}$ strongly depends on the mutual information between the data of that variable and the second set of data Y. This may be advantageous if a variable must be added to the previously accepted reduced set of variables $S_{r\_accepted}$, because the probability that the value of the optimization function increases if that variable is added is large—however, this may be disadvantageous if the variable must be removed from the previously accepted reduced set of variables $S_{r\_accepted}$. Therefore it is wise to use β that is closer to the center of the range [0,1] than to the boundaries of the range. In an alternative embodiment, it is first determined whether a variable is added to the previously accepted reduced set of variables $S_{r\_accepted}$ or that a variable is removed from the previously accepted reduced set of variables $S_{r\_accepted}$ this may be done by using uniform probabilities for adding and removing. Subsequently, depending on the selected action, the selection probability is based strongly based on a uniformly distribution probability (for removing) or based on a probability that strongly depends on a mutual information of the data of the variable and the second set of data Y (for adding). In yet another embodiment, it is first randomly determined whether a variable is added or removed (with equal probabilities). Subsequently: if a variable must be added, the random selection of the variable to be added uses probabilities that are strongly based on a mutual information of the data of the variable and the second set of data Y; if a variable must be removed, the probabilities for the random selection may be inverse proportional to this mutual information (e.g. proportional to the conditional entropy for the second set of data given the data of the single variable, H(Y|D)). Also other embodiments of proposing a reduced set of variables $S_{r\_proposal}$ may be used—for example, embodiments are not limited to adding or removing one variable per iteration.

In line with the above discussed stages of determining 212 a second mutual information $I_2$ and of clustering 214 data, the searching unit 110 of device 100 may comprise a second mutual information determining unit 106 for determining a second mutual information I2 and a clustering unit 108 for clustering data. The second mutual information determining unit 106 and the clustering unit 108 are configured to perform the function of the above discussed stages of determining 212 a second mutual information $I_2$ and of clustering 214 data and have similar embodiments with similar effects.

Figure 4:
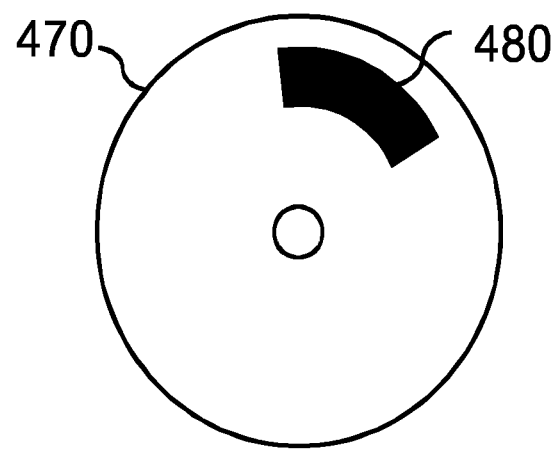

FIG. 4 schematically shows an embodiment of a computer program product 470 which program is operative to cause a processor to perform one of the previously discussed methods. Embodiments also extends to computer program products 470, particularly computer programs 480 on or in a carrier 470, adapted for putting the invention into practice. The computer program product may comprises a computer program 480. The program may be in the form of source code, object code, a code intermediate source and object code such as partially compiled form, or in any other form suitable for use in the implementation of the one of the above discussed methods. It will also be appreciated that such a program may have many different architectural designs. For example, a program code implementing the functionality of the method or device may be subdivided into one or more subroutines. Many different ways to distribute the functionality among these subroutines will be apparent to the skilled person. The subroutines may be stored together in one executable file to form a self-contained program. Such an executable file may comprise computer executable instructions, for example processor instructions and/or interpreter instructions (e.g. Java interpreter instructions). Alternatively, one or more or all of the subroutines may be stored in at least one external library file and linked with a main program either statically or dynamically, e.g. at run-time. The main program contains at least one call to at least one of the subroutines. Also, the subroutines may comprise function calls to each other. An embodiment relating to a computer program product 470 comprises computer executable instructions 480 corresponding to each of the processing steps of at least one of the methods set forth. These instructions may be subdivided into subroutines and/or be stored in one or more files that may be linked statically or dynamically. Another embodiment relating to a computer program product 470 comprises computer executable instructions 480 corresponding to each of the means of at least one of the systems and/or products set forth. These instructions may be subdivided into subroutines and/or be stored in one or more files that may be linked statically or dynamically.

The carrier of a computer program may be any entity or device capable of carrying the program. For example, the carrier may include a storage medium, such as a ROM, for example a CD ROM or a semiconductor ROM, or a magnetic recording medium, for example a floppy disc or hard disk. Further the carrier may be a transmissible carrier such as an electrical or optical signal, which may be conveyed via electrical or optical cable or by radio or other means. When the program is embodied in such a signal, the carrier may be constituted by such cable or other device or means. Alternatively, the carrier may be an integrated circuit in which the program is embedded, the integrated circuit being adapted for performing, or for use in the performance of, the relevant method.

The computer program 480 may be a computer program for a distributed processor system and may comprise computer code which causes a first processor system to perform a subset of the steps of the above discussed method and which causes a second processor system to perform another subset of the steps of the above discussed method. The subset of steps and the another subset of steps may be mutually exclusive.

In summary, this document provides a device for and a method of selecting a subset of variables from a set of variables are provided. Instances of the plurality of variables comprise information to predict an instance of a further type of data. The device comprises a first data set unit, a second data set unit and a searching unit. The first data set unit obtains a first set comprising tuples of instances of data. The second data set unit obtains a second set comprising instances of the further type of data. Each instance of the second set corresponds to one of the tuples of the first set. The searching unit obtains a reduced set of variables that represents an at least local optimum of an optimization function being a combination of a first mutual information value between the reduced first set and the second set and a penalty value being based on a number of variables in the reduced set of variables.

Further Embodiments are Defined in the Subsequent Clauses:

1. A device (100) for selecting a subset of variables from a set of variables comprising a plurality of variables, the plurality of variables representing different types of data, instances of the plurality of variables comprising information to predict an instance of a further type of data, the further type of data relating to a characteristic of a physical entity, the device comprising:

a first data set unit (102) for obtaining a first set of data comprising tuples of instances of data, wherein each tuple comprises an instance of each variable of the set of variables, a second data set unit (104) for obtaining a second set of data comprising instances of the further type of data, wherein each instance of the second set of data corresponds to one of the tuples of the first set of data, a searching unit (110) for obtaining a reduced set of variables being a subset of the set of variables, the reduced set of variables representing an at least local optimum of an optimization function being a function of a reduced first set of data, the second set of data and the reduced set of variables, the reduced first set of data comprising reduced tuples obtained from the tuples of the first data set and the reduced tuples only comprising instances of the variables of the reduced set of variables, the optimization function being based on a combination of a first mutual information value between the reduced first set of data and the second set of data and a penalty value that increases with an increasing number of variables in the reduced set of variables, and an output (112) for providing the reduced set of variables as the selected subset of variables to, for example, a data reduction arrangement for reducing the amount of data in the first set of data.

2. A method (200) of selecting a subset of variables from a set of variables comprising a plurality of variables, the plurality of variables representing different types of data, instances of the plurality of variables comprising information for predict an instance of a further type of data, the further type of data relating to a characteristic of a physical entity, the method comprising:

obtaining (202) a first set of data comprising tuples of instances of data, wherein each tuple comprises an instance of each variable of the set of variables, obtaining (204) a second set of data comprising instances of the further type of data, wherein each instance of the second set of data corresponds to one of the tuples of the first set of data, searching (206) for a reduced set of variables being a subset of the set of variables, the reduced set of variables representing an at least local optimum of an optimization function being a function of a reduced first set of data, the second set of data and the reduced set of variables, the reduced first set of data comprising reduced tuples obtained from the tuples of the first data set and the reduced tuples only comprising instances of the variables of the reduced set of variables, the optimization function being based on a combination of a first mutual information value between the reduced first set of data and the second set of data and a penalty value that increases with an increasing number of variables in the reduced set of variables, and providing (220) the reduced set of variables as the selected subset of variables to, for example, a data reduction arrangement for reducing the amount of data in the first set of data.

3. A method (200) of selecting a subset of variables according to clause 2, wherein the first mutual information value between the reduced first set of data and the second set of data is estimated by determining (212) a second mutual information value between the second set of data and clustered data, wherein the clustered data comprises clusters that are derived from the reduced first set of data.

4. A method (200) of selecting a subset of variables according to clause 3, wherein the clusters are derived from a combination of the reduced first set of data and the second set of data.

5. A method (200) of selecting a subset of variables according to clause 4, wherein the clusters represents tuples of data that are a combination of a specific tuple of the reduced first set of data that is extended with a value that is derived from an instance from the second set of data that corresponds to the specific tuple of the reduced first set of data.

6. A method (200) of selecting a subset of variables according to clause 5, wherein the clusters are formed on basis of data that comprises unique tuples of the reduced first set of data that are extended with a value that is derived from the instances from the second set of data that correspond to the respective unique tuple.

7. A method (200) of selecting a subset of variables according to any one of the clauses 3 to 6, wherein the clustered data is obtained by a k-means clustering algorithm.

8. A method (200) of selecting a subset of variables according to clause 7, wherein the k-means clustering algorithms uses a Euclidean distance measure to determine distances between the tuples to be clustered.

9. A method (200) of selecting a subset of variables according to any one of the clauses 2 to 8, wherein searching (206) for the reduced set of variables representing the at least local optimum of the optimization function is performed by applying an iterative search method to find the at least local maximum to find the reduced set of variables that has a relatively large value for the optimization function.

10. A method (200) of selecting a subset of variables according to clause 9, wherein the iterative search method is based on simulated annealing.

11. A method (200) of selecting a subset of variables according to any one of the clauses 9 or 10, wherein each iteration of the iterative search method comprising forming (222) a proposal of the reduced set of variables to be assessed, determining (210) the value of the optimization function that is provided by the proposed reduced set of variables, storing (216) the proposed reduced set of variables as a best reduced set of variables if the proposed reduced set of variables provides a best value for the optimization function until the currently executed iteration, deciding (218) whether the proposed reduced set of variables is accepted as a basis for a subsequent proposal of the reduced set of variables to be assessed in a subsequent iteration.

12. A method (200) of selecting a subset of variables according to any one of the clauses 9 or 11, wherein the iterative search method starts (208) a first iteration with a proposal of the reduced set of variables comprising a single variable of which the mutual information between that the data of the single variable and the second set of data is highest compared to the other variables of the set of variables.

13. A method (200) of selecting a subset of variables according to any one of the clauses 11 or 12 in so far clause 12 refers to clause 11, wherein, in the second or later iterations, the proposal of the reduced set of variables to be assessed is formed by extending or reducing the last accepted reduced set of variables, wherein one of the variables of the set of variables is randomly selected, the randomly selected variable being added to the last accepted reduced set of variables if the randomly selected variable is not yet present in the last accepted reduced set of variables, and the randomly selected variable is removed from the last accepted reduced set of variables if the randomly selected variable is present in the last accepted reduced set of variables.

14. A method (200) of selecting a subset of variables according to clause 13, wherein the randomly selected variable is obtained by a random selection that is based on a probability for each variable that is a sum of a first portion of a uniform probability value for all variables and a second portion of a non-uniform probability value derived from the mutual information between the specific variable and the second set of data.

15. Computer program product (470) for selecting a subset of variables from a set of variables comprising a plurality of variables, which program (280) is operative to cause a processor to perform one of the methods according to one of the clauses 2 to 14.

It is to be noted that the invention may be implemented in hardware and/or software, using programmable components.

It will be appreciated that the above description for clarity has described embodiments of the invention with reference to different functional units and processors. However, it will be apparent that any suitable distribution of functionality between different functional units or processors may be used without deviating from the invention. For example, functionality illustrated to be performed by separate units, processors or controllers may be performed by the same processor or controllers. Hence, references to specific functional units are only to be seen as references to suitable means for providing the described functionality rather than indicative of a strict logical or physical structure or organization. The invention can be implemented in any suitable form including hardware, software, firmware or any combination of these.

It is noted, that in this document the word 'comprising' does not exclude the presence of other elements or steps then those listed and the word 'a' or 'an' preceding an element does not exclude the presence of a plurality of such elements, that any reference signs do not limit the scope of the claims, that the invention may be implemented by means of both hardware and software, and that several 'means' or 'units' may be represented by the same item of hardware or software, and a processor may fulfill the function of one or more units, possibly in cooperation with hardware elements. Further, the invention is not limited to the embodiments, and the invention lies in each and every novel feature or combination of features described above or recited in mutually different dependent claims.

The invention claimed is:

1. A data reduction machine for reducing a data set based on a subset of variables from a set of variables comprising a plurality of variables, the plurality of variables representing different types of data, instances of the plurality of variables being based on sensor data and comprising information to predict an instance of a further type of data, the further type of data relating to a characteristic of a physical entity, the data reduction machine comprising:
a first data set unit configured for obtaining a first set of data comprising tuples of instances of data, wherein each tuple comprises an instance of each variable of the set of variables;
a second data set unit configured for obtaining a second set of data comprising instances of the further type of data, wherein each instance of the second set of data corresponds to one of the tuples of the first set of data;
a searching unit configured for obtaining a reduced set of variables being a subset of the set of variables, the reduced set of variables representing an at least local optimum of an optimization function being a function of a reduced first set of data, the second set of data and the reduced set of variables, the reduced first set of data comprising reduced tuples obtained from the tuples of the first set of data, and the reduced tuples only comprising instances of the variables of the reduced set of variables, the optimization function being based on a combination of a first mutual information value between the reduced first set of data and the second set of data and a penalty value that increases with an increasing number of variables in the reduced set of variables; and
a data reduction unit configured for generating a reduced data set from a data set that comprises tuples of instances of data, wherein each tuple comprises an instance of each variable of the set of variables, the reduced data set comprising instances of data of variables that are present in the reduced set of variables.

2. A method of reducing a data set based on a subset of variables from a set of variables comprising a plurality of variables, the plurality of variables representing different types of data, instances of the plurality of variables being based on sensor data and comprising information to predict an instance of a further type of data, the further type of data relating to a characteristic of a physical entity, the method comprising:
obtaining a first set of data comprising tuples of instances of data, wherein each tuple comprises an instance of each variable of the set of variables;
obtaining a second set of data comprising instances of the further type of data, wherein each instance of the second set of data corresponds to one of the tuples of the first set of data;
searching for a reduced set of variables being a subset of the set of variables, the reduced set of variables representing an at least local optimum of an optimization function being a function of a reduced first set of data, the second set of data and the reduced set of variables, the reduced first set of data comprising reduced tuples obtained from the tuples of the first set of data, and the reduced tuples only comprising instances of the variables of the reduced set of variables, the optimization function being based on a combination of a first mutual information value between the reduced first set of data and the second set of data and a penalty value that increases with an increasing number of variables in the reduced set of variables; and
generating a reduced data set from a data set that comprises tuples of instances of data, wherein each tuple comprises an instance of each variable of the set of variables, the reduced data set comprising instances of data of variables that are present in the reduced set of variables.

3. The method according to claim 2, wherein the first mutual information value between the reduced first set of data and the second set of data is estimated by determining a second mutual information value between the second set of data and clustered data, wherein the clustered data comprises clusters that are derived from the reduced first set of data.

4. The method according to claim 3, wherein the clusters are derived from a combination of the reduced first set of data and the second set of data.

5. The method according to claim 4, wherein the clusters represents tuples of data that are a combination of a specific tuple of the reduced first set of data that is extended with a value that is derived from an instance from the second set of data that corresponds to the specific tuple of the reduced first set of data.

6. The method according to claim 5, wherein the clusters are formed on basis of data that comprises unique tuples of the reduced first set of data that are extended with a value that is derived from the instances from the second set of data that correspond to the respective unique tuple.

7. The method according to claim 3, wherein the clustered data is obtained by a k-means clustering algorithm.

8. The method according to claim 7, wherein the k-means clustering algorithms uses a Euclidean distance measure to determine distances between the tuples to be clustered.

9. The method according to claim 2, wherein searching for the reduced set of variables representing the at least local optimum of the optimization function is performed by applying an iterative search method to find the at least local maximum to find the reduced set of variables that has a relatively large value for the optimization function.

10. The method according to claim 9, wherein the iterative search method is based on simulated annealing.

11. The method according to claim 9, wherein each iteration of the iterative search method comprises:
forming a proposal of the reduced set of variables to be assessed;
determining the value of the optimization function that is provided by the proposed reduced set of variables;
storing the proposed reduced set of variables as a best reduced set of variables if the proposed reduced set of variables provides a best value for the optimization function until the currently executed iteration;
deciding whether the proposed reduced set of variables is accepted as a basis for a subsequent proposal of the reduced set of variables to be assessed in a subsequent iteration.

12. The method according to claim 9, wherein the iterative search method starts a first iteration with a proposal of the reduced set of variables comprising a single variable of which the mutual information between that the data of the single variable and the second set of data is highest compared to the other variables of the set of variables.

13. The method according to claim 12, wherein, in the second or later iterations, the proposal of the reduced set of variables to be assessed is formed by extending or reducing the last accepted reduced set of variables, wherein one of the variables of the set of variables is randomly selected, the randomly selected variable being added to the last accepted reduced set of variables if the randomly selected variable is not yet present in the last accepted reduced set of variables, and the randomly selected variable is removed from the last accepted reduced set of variables if the randomly selected variable is present in the last accepted reduced set of variables.

14. The method according to claim 13, wherein the randomly selected variable is obtained by a random selection that is based on a probability for each variable that is a sum of a first portion of a uniform probability value for all variables and a second portion of a non-uniform probability value derived from the mutual information between the specific variable and the second set of data.

15. A machine, comprising:
a plurality of sensors configured to generate sensor data;
a physical entity; and
a processor to perform a method for reducing a data set based on a subset of variables from a set of variables comprising a plurality of variables, the plurality of variables representing different types of data, instances of the plurality of variables being based on sensor data and comprising information to predict an instance of a further type of data, the further type of data relating to a characteristic of the physical entity, the method comprising:
obtaining a first set of data comprising tuples of instances of data, wherein each tuple comprises an instance of each variable of the set of variables;
obtaining a second set of data comprising instances of the further type of data, wherein each instance of the second set of data corresponds to one of the tuples of the first set of data;
searching for a reduced set of variables being a subset of the set of variables, the reduced set of variables representing an at least local optimum of an optimization function being a function of a reduced first set of data, the second set of data and the reduced set of variables, the reduced first set of data comprising reduced tuples obtained from the tuples of the first set of data, and the reduced tuples only comprising instances of the variables of the reduced set of variables, the optimization function being based on a combination of a first mutual information value between the reduced first set of data and the second set of data and a penalty value that increases with an increasing number of variables in the reduced set of variables; and
generating a reduced data set from a data set that comprises tuples of instances of data, wherein each tuple comprises an instance of each variable of the set of variables, the reduced data set comprising instances of data of variables that are present in the reduced set of variables.

16. A non-transitory computer-readable medium having one or more executable instructions stored thereon, which when executed by a processor, cause the processor to perform a method for reducing a data set based on a subset of variables from a set of variables comprising a plurality of variables, the plurality of variables representing different types of data, instances of the plurality of variables being based on sensor data and comprising information to predict an instance of a further type of data, the further type of data relating to a characteristic of the physical entity, the method comprising:
obtaining a first set of data comprising tuples of instances of data, wherein each tuple comprises an instance of each variable of the set of variables;
obtaining a second set of data comprising instances of the further type of data, wherein each instance of the second set of data corresponds to one of the tuples of the first set of data;
searching for a reduced set of variables being a subset of the set of variables, the reduced set of variables representing an at least local optimum of an optimization function being a function of a reduced first set of data, the second set of data and the reduced set of variables, the reduced first set of data comprising reduced tuples obtained from the tuples of the first set of data, and the reduced tuples only comprising instances of the variables of the reduced set of variables, the optimization function being based on a combination of a first mutual information value between the reduced first set of data and the second set of data and a penalty value that increases with an increasing number of variables in the reduced set of variables; and
generating a reduced data set from a data set that comprises tuples of instances of data, wherein each tuple comprises an instance of each variable of the set of variables, the reduced data set comprising instances of data of variables that are present in the reduced set of variables.

* * * * *